(12) United States Patent
Li et al.

(10) Patent No.: US 11,150,308 B2
(45) Date of Patent: Oct. 19, 2021

(54) BATTERY MANAGEMENT DEVICE, METHOD AND CHIP

(71) Applicant: DATANG NXP SEMICONDUCTORS CO., LTD, Jiangsu (CN)

(72) Inventors: Johnny Li, Shanghai (CN); Hai Li, Shanghai (CN)

(73) Assignee: DATANG NXP SEMICONDUCTORS CO., LTD., Jiangsu (CN)

( * ) Notice: Subject to any disclaimer, the term of this patent is extended or adjusted under 35 U.S.C. 154(b) by 0 days.

(21) Appl. No.: 16/753,095

(22) PCT Filed: Jun. 17, 2019

(86) PCT No.: PCT/CN2019/091531
§ 371 (c)(1),
(2) Date: Apr. 2, 2020

(87) PCT Pub. No.: WO2020/082760
PCT Pub. Date: Apr. 30, 2020

(65) Prior Publication Data
US 2021/0025946 A1 Jan. 28, 2021

(30) Foreign Application Priority Data

Oct. 23, 2018 (CN) .......................... 201811239812.6

(51) Int. Cl.
*G01R 31/389* (2019.01)
*B60L 58/10* (2019.01)
(Continued)

(52) U.S. Cl.
CPC ............ *G01R 31/389* (2019.01); *B60L 58/10* (2019.02); *H01M 10/4257* (2013.01);
(Continued)

(58) Field of Classification Search
CPC .. G01R 31/389; B60L 58/10; H01M 10/4257; H01M 10/443; H01M 2010/4271; H01M 2220/20
(Continued)

(56) References Cited

U.S. PATENT DOCUMENTS 5,608,333 A * 3/1997 Hayashi ............... G01R 17/105
324/703
6,554,762 B2 * 4/2003 Leysieffer ............ H04R 25/407
600/25
(Continued)

FOREIGN PATENT DOCUMENTS

CN 101527448 A 9/2009
CN 102231549 A 11/2011
(Continued)

OTHER PUBLICATIONS

International Search Report and Written Opinion for PCT/CN2019/091531.
(Continued)

*Primary Examiner* — M Baye Diao
(74) *Attorney, Agent, or Firm* — Nixon Peabody LLP; Jeffrey L. Costellia

(57) ABSTRACT

The disclosure provides a battery management device, method, and a chip. The device includes: an analog-digital converter connected with a first power supply access terminal, a second power supply access terminal and an impedance measuring element: wherein the analog-digital converter is configured to achieve analog-digital conversion between an accessed power supply and the impedance measuring element; the impedance measuring element is further connected with a comparator and a driving element; the impedance measuring element is configured to test an impedance of the accessed power supply; the comparator is configured to compensate delay generated by the driving
(Continued)

element and an excitation signal generator; and the driving element is configured to drive the battery management device to work; and the excitation signal generator is connected with the comparator, the driving element, the first power supply access terminal and the second power supply access terminal.

10 Claims, 2 Drawing Sheets

(51) Int. Cl.
*H01M 10/42* (2006.01)
*H01M 10/44* (2006.01)

(52) U.S. Cl.
CPC .. *H01M 10/443* (2013.01); *H01M 2010/4271* (2013.01); *H01M 2220/20* (2013.01)

(58) Field of Classification Search
USPC .......................................................... 324/430
See application file for complete search history.

(56) References Cited

U.S. PATENT DOCUMENTS

| | | | | |
|---|---|---|---|---|
| 7,392,985 | B1* | 7/2008 | Lam | A63F 3/00 |
| | | | | 273/238 |
| 8,896,315 | B1* | 11/2014 | Davies | H02J 7/0019 |
| | | | | 324/434 |
| 9,696,357 | B2* | 7/2017 | Voisine | G01R 27/205 |
| 10,386,419 | B2* | 8/2019 | Kanai | G01R 31/3828 |
| 2002/0026091 | A1 | 2/2002 | Leysieffer | |
| 2013/0320947 | A1* | 12/2013 | Noh | G06F 1/26 |
| | | | | 323/283 |
| 2015/0006095 | A1* | 1/2015 | Voisine | G01R 31/3274 |
| | | | | 702/65 |
| 2017/0003355 | A1 | 1/2017 | Ranieri et al. | |
| 2018/0217209 | A1 | 8/2018 | Marsili et al. | |
| 2019/0305386 | A1* | 10/2019 | Lee | H01M 10/486 |

FOREIGN PATENT DOCUMENTS

| | | | | |
|---|---|---|---|---|
| CN | 103427132 A | 12/2013 | | |
| CN | 106771634 A | 5/2017 | | |
| CN | 108376805 A | 8/2018 | | |
| CN | 109591658 A | 4/2019 | | |
| EP | 1351068 A2 | 10/2003 | | |
| EP | 2667166 A2 | 11/2013 | | |
| EP | 3471186 A1 * | 4/2019 | .......... | H02J 7/00036 |
| JP | 2012-163510 A | 2/2011 | | |
| JP | 2017-118642 A | 12/2015 | | |
| JP | 2018-146441 A | 3/2017 | | |
| KR | 101088203 B1 * | 11/2011 | ....... | G01R 31/31924 |
| KR | 101088203 B1 | 11/2011 | | |

OTHER PUBLICATIONS

EESR for EP 19861260.8 dated Nov. 20, 2020, 10 pages.
JP Notice of Rejection for JP 2020-522828 dated Dec. 15, 2020, 3 pages.
CN Search Report for CN201811239812.6 dated Mar. 10, 2021, 3 pages.
CN Office Action for CN201811239812.6 dated Mar. 18, 2021, 5 pages.

* cited by examiner

BATTERY MANAGEMENT DEVICE, METHOD AND CHIP

CROSS-REFERENCE TO RELATED APPLICATIONS

This application is the National Phase of International Application PCT/CN2019/091531, filed Jun. 17, 2019, which designated the United States. This application claims the priority to Chinese Patent Application No. 201811239812.6 filed in the State Intellectual Property Office of the P.R.C. on Oct. 23, 2018, and titled "Battery Management Device, Method and Chip", the entire contents of which are incorporated herein by reference.

FIELD OF TECHNOLOGY

The disclosure relates to the field of new energy technologies, and more particularly, to a battery management device, method and chip.

BACKGROUND

With the development of new energy technologies, hybrid electric automobiles and electric automobiles are increasingly studied. In the hybrid electric automobiles and the electric automobiles, a battery is a source of power, and a state-of-health of the battery is an important index of the hybrid electric automobiles and the electric automobiles.

In the prior art, when battery index management is carried out, a temperature index of the battery is managed typically. The temperature of the battery will be detected through a sensor and the like, and two to three control values are set. When the temperature reaches a certain given high temperature limit, a battery management system can manage the battery by limiting a output power of the battery and the like.

However, in the prior art, when the battery is measured and managed, corresponding management can be carried out only when the temperature of the battery reaches a certain value, and the measurement of the temperature value is easily influenced by an external temperature and the like, so that the measurement is not accurate enough, and the battery cannot be better managed.

SUMMARY

Embodiments of the disclosure provide a battery management device, method and chip, so as to solve a technical problem of inaccurate index test during battery management.

In order to solve the foregoing technical problem, in a first aspect, the embodiments of the disclosure further provide a battery management device, including:

an analog-digital converter, an impedance measuring element, a comparator, a driving element, an excitation signal generator, a first power supply access terminal and a second power supply access terminal, wherein:

the analog-digital converter is connected with the first power supply access terminal, the second power supply access terminal and the impedance measuring element; the analog-digital converter is configured to achieve analog-digital conversion between an accessed power supply and the impedance measuring element; and the accessed power supply is, when the battery management device works, a power supply to which the first power supply access terminal and the second power supply access terminal are accessed;

the impedance measuring element is further connected with the comparator and the driving element; the impedance measuring element is configured to test an impedance of the accessed power supply; the comparator is configured to compensate a delay generated by the driving element and the excitation signal generator; and the driving element is configured to drive the battery management device to work; and the excitation signal generator is connected with the comparator, the driving element, the first power supply access terminal and the second power supply access terminal, and the excitation signal generator is configured to generate an excitation signal.

In a second aspect, the embodiments of the disclosure also provide a battery management method applied to the battery management device described above, wherein the method includes:

calculating a delay value when the first power supply access terminal and the second power supply access terminal are accessed to a preset direct current power supply;

setting a register value of a register unit to be the delay value; and calculating an impedance value of a power supply to be measured when the first power supply access terminal and the second power supply access terminal are accessed to the power supply to be measured.

In a third aspect, the embodiments of the disclosure further provide a battery management chip, including at least one battery management device described above, wherein at least one of the battery management devices is connected in cascade; and each of the battery management device correspondingly manages one power supply to be measured.

The embodiments of the disclosure provide the power management device including the analog-digital converter, the impedance measuring element, the comparator, the driving element, the excitation signal generator, the first power supply access terminal and the second power supply access terminal. The comparator can compensate for the delay generated by the driving element and the excitation signal generator, so that the impedance measuring element can accurately measure the impedance of the power supply to be measured (such as a battery) to which the first power supply access terminal and the second power supply access terminal are accessed. The impedance is the best index that reflects a SOH (State-of-Health, Health State) and a SOC (State-of-Charge, Load State) of the battery, and there is a corresponding relationship between a result of the impedance and the temperature of the battery. Therefore, performance indexes of the power supply to be measured can be accurately measured in an accurate impedance testing mode through the battery management device according to the embodiments of the disclosure.

DESCRIPTION OF THE EMBODIMENTS

Hereinafter, the technical solution in the embodiments of the disclosure are illustrated clearly and completely with the accompanying drawings in the embodiments of the disclosure. Apparently, the described embodiments are merely some but not all of the embodiments of the disclosure. Based on the embodiments of the disclosure, those having ordinary skills in the art may obtain all the other embodiments without creativity, which are all in the scope of the disclosure.

First Embodiment

Figure 1:
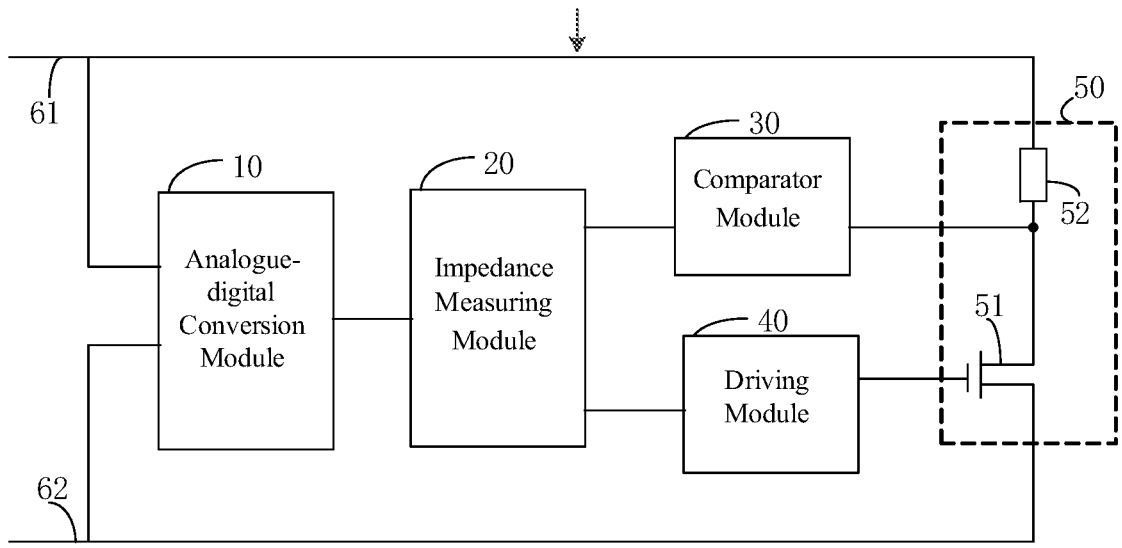
FIG. 1 is a structural block diagram of a battery management device according to a first embodiment of the disclosure.

Referring to FIG. 1, a structural block diagram of a battery management device in an embodiment of the disclosure is illustrated.

In the embodiment of the disclosure, the battery management device may be applied to an automobile Battery Management System (BMS), and performances of the battery can be accurately measured through the battery management device.

In an embodiment of the disclosure, referring to FIG. 1, the battery management device includes an analog-digital converter 10, an impedance measuring element 20, a comparator 30, a driving element 40, an excitation signal generator 50, a first power supply access terminal 61 and a second power supply access terminal 62.

The analog-digital converter 10 is connected with the first power supply access terminal 61, the second power supply access terminal 62 and the impedance measuring element 20. The analog-digital converter 10 is configured to achieve analog-digital conversion between an accessed power supply and the impedance measuring element 20. The accessed power supply is, when the battery management device works, a power supply to which the first power supply access terminal 61 and the second power supply access terminal 62 are accessed.

The impedance measuring element 20 is further connected with the comparator 30 and the driving element 40. The impedance measuring element 20 is configured to test an impedance of the accessed power supply; and the comparator 30 is configured to compensate a delay generated by the driving element 40 and the excitation signal generator 50. The driving element 40 is configured to drive the battery management device to work. The excitation signal generator 50 is connected with the comparator 30, the driving element 40, the first power supply access terminal 61 and the second power supply access terminal 62, and the excitation signal generator 50 is configured to generate an excitation signal.

In the embodiment of the disclosure, when the first power supply access terminal 61 and the second power supply access terminal 62 of the battery management device are accessed to the power supply to start work, the driving element 40 may drive the excitation signal generator 50 to work, and an excitation signal can be generated through the excitation signal generator 50. The excitation signal is a signal required when the impedance measuring element 20 performs impedance measurement. A feedback signal configured to feed back a voltage in the excitation signal generator 50 may be output to the impedance measuring element 20 via the comparator 30. When the accessed power supply is an ideal power supply (a power supply that hardly generates phase shift), the impedance measuring element 20 can easily obtain a delay value between the driving element 40 and the excitation signal generator 50 by comparing an input signal of the driving element 40 with an output signal of the comparator 30, and set the delay value as a compensation value of the comparator 30. Therefore, a delay generated when propagating a signal of the accessed power supply by the driving element 40 and the excitation signal generator 50 can be compensated through calculating the compensation value by the comparator 30. And the analog-digital converter 10 can convert the collected voltage signal of the accessed power supply into a digital signal and transmit the digital signal to the impedance measuring element 20, so that an impedance of the accessed power supply can be accurately obtained through modulation, demodulation and other processing in the impedance measuring element 20.

In the embodiment of the disclosure, the accessed power supply may be a battery, and an impedance of the battery may be generally expressed by amplitude and phase. In specific applications, the impedance value of the accessed power supply can be tested by the impedance measuring element 20 through an orthogonal calculating method, etc. The impedance value usually includes a real part of impedance and an imaginary part of impedance. The impedance value can reflect operating condition and temperature condition of the accessed power supply, so that the accessed power supply can be further managed to reduce power, shut down and charge, or the like.

As a preferred mode of the embodiment of the disclosure, as shown in FIG. 1, the excitation signal generator 50 includes a field effect unit 51 and a resistor 52.

A gate terminal of the field effect unit 51 is connected with the driving element 40. A drain terminal of the field effect unit 51 is connected with the comparator 30 and one terminal of the resistor 52. A source terminal of the field effect unit 51 is connected with the second power supply access terminal 62. The other terminal of the resistor 52 is connected with the first power supply access terminal 61.

In the embodiment of the disclosure, the driving element 40 can control to switch on or switch off the field effect unit 51. When the field effect unit 51 is in a switched-on state, the field effect unit 51 can form a loop together with the external resistor 52, so that an excitation current can be generated in a loop formed by the battery management device. At this time, one end of the comparator 30 is connected with the drain terminal of the field effect unit 51, and the other end of the comparator 30 is connected with the impedance measuring element 20. The comparator 30 can calculate a delay value between the driving element 40 and the drain terminal of the field effect unit 51 by comparing the input signal of the driving element 40 with the output signal of the comparator 30, and use the delay value to compensate for a phase error in the impedance measurement of the battery. Therefore, the impedance value inside the battery can be accurately calculated by the impedance measuring element 20.

In specific applications, the stronger a driving capability of the driving element 40 is, the larger an occupied area of the battery management device is, especially when the battery management device is installed on an integrated circuit chip, the driving element 40 with strong driving capability will occupy a larger area overhead. Therefore, in order to reduce the area overhead of the battery management device, the driving capability of the driving element 40 is usually set to be relatively small, and preferably, a driving power of the driving element 40 satisfies a third preset condition. In specific applications, the driving power satisfying the third preset condition may be that the driving power is less than a preset power. The preset power may be determined by those skilled in the art according to actual application scenarios, and this is not specifically limited in the embodiment of the disclosure.

In specific applications, if the driving capability of the driving element 40 is weak while parasitic parameter capacitance values of the gate terminal and the source terminal of the field effect unit 51 are large, the signal propagation between the driving element 40 and the field effect unit 51 will have a large delay. However, in order to generate an excitation signal with a better signal-to-noise ratio performance (e.g., excitation current), the field effect unit 51 is generally set with a larger parasitic parameter capacitance. Moreover, in order to improve the measuring accuracy, the field effect unit 51 is usually set with a smaller drain-source resistance. Preferably, the parasitic parameter capacitance value of the field effect unit 51 satisfies a first preset condition; a drain source resistance of the field effect unit 51 satisfies a second preset condition, and the drain source resistance is a resistance between the source terminal and the drain terminal of the field effect unit 51.

In specific applications, the parasitic parameter capacitance value satisfying the first preset condition may be that the parasitic parameter capacitance value is greater than a preset capacitance value. The preset capacitance value may be determined by those skilled in the art according to actual application scenarios, and this is not specifically limited in the embodiment of the disclosure. The drain source resistance satisfying the second preset condition may be that a value of the drain source resistance is smaller than a preset resistance value. The preset resistance value may be determined by those skilled in the art according to actual application scenarios, and this is not specifically limited in the embodiment of the disclosure.

In the embodiment of the disclosure, the comparator 30 can monitor a drain terminal voltage of the field effect unit 51. The comparator 30 may be a high-speed comparator having a delay much smaller than the delay between the driving element 40 and the field effect unit 51. By comparing the input signal of the driving element 40 with the output signal of the comparator 30, the delay value between the driving element 40 and the field effect unit 51 can be easily calculated. Preferably, the comparator 30 includes a register unit, so that a register value in the register unit can be set to the delay value, thus compensating for the delay caused by the driving element 40 and the field effect unit 51.

In practical applications, after each element in the battery management device is assembled, the battery management device is accessed to an ideal power supply to determine a delay value to be set in the register unit in the comparator 30, and then the delay value is a delay value conforming to the battery management device. In subsequent management of an actual battery by the battery management device, an accurate battery impedance value can be obtained.

As a preferred mode of the embodiment of the disclosure, the accessed power supply includes a preset direct current power supply, and a power supply to be measured. The impedance measuring element 20 is further configured to calculate a delay value when the first power supply access terminal 61 and the second power supply access terminal 62 are accessed to the preset direct current power supply. The register unit is configured to set a register value to be the delay value. The impedance measuring element 20 is further configured to calculate an impedance value of the power supply to be measured when the first power supply access terminal 61 and the second power supply access terminal 62 are accessed to the power supply to be measured.

In the embodiment of the disclosure, the preset direct current power supply may be close to an ideal power supply that hardly generates phase shift. Therefore, when the first power supply access terminal 61 and the second power supply access terminal 62 are accessed to the preset direct current power supply, a delay value caused by the driving element 40 and the field effect unit 51 can be tested by the impedance measuring element 20. The register unit in the comparator 30 is configured to set the register value to the delay value, thus compensating for the delay caused by the driving element 40 and the field effect unit 51. When the first power supply access terminal 61 and the second power supply access terminal 62 are accessed to the power supply to be measured, the delay caused by the driving element 40 and the field effect unit 51 can be prevented from being mistaken as the delay of the power supply to be measured, so that the calculated impedance value of the power supply to be measured is more accurate.

In the embodiment of the disclosure, the delay caused by the driving element 40 and the field effect unit 51 can be compensated by the comparator 30. The comparator 30 may also be configured to detect a performance of the field effect unit 51 to meet the needs of battery management. Moreover, only a small area overhead is needed by the comparator 30.

In specific applications, the field effect unit 51 may be a MOSFET (Metal-Oxide-Semiconductor Field-Effect Transistor) or another field effect transistor. The type of the field effect unit 51 is not specifically limited in the embodiment of the disclosure.

In conclusion, the embodiment of the disclosure provides the power management device including the analog-digital converter, the impedance measuring element, the comparator, the driving element, the excitation signal generator, the first power supply access terminal and the second power supply access terminal. The comparator can compensate for the delay generated by the driving element and the excitation signal generator, so that the impedance measuring element can accurately measure the impedance of the power supply to be measured (such as a battery) to which the first power supply access terminal and the second power supply access terminal are accessed. The impedance is the best index that reflects a SOH and a SOC of the battery, and there is a corresponding relationship between a result of the impedance and the temperature of the battery. Therefore, performance indexes of the power supply to be measured can be accurately measured in an accurate impedance testing mode through the battery management device according to the embodiment of the disclosure.

It should be noted that for ease of description, the aforementioned device embodiments are all expressed as a series of element combinations, but those skilled in the art should know that some elements can be practiced with other components according to the disclosure. Secondly, those skilled in the art should also know that all the embodiments described in the specification are preferred embodiments, and the actions or elements involved are not necessarily required by the embodiments of the disclosure.

Second Embodiment

Figure 2:
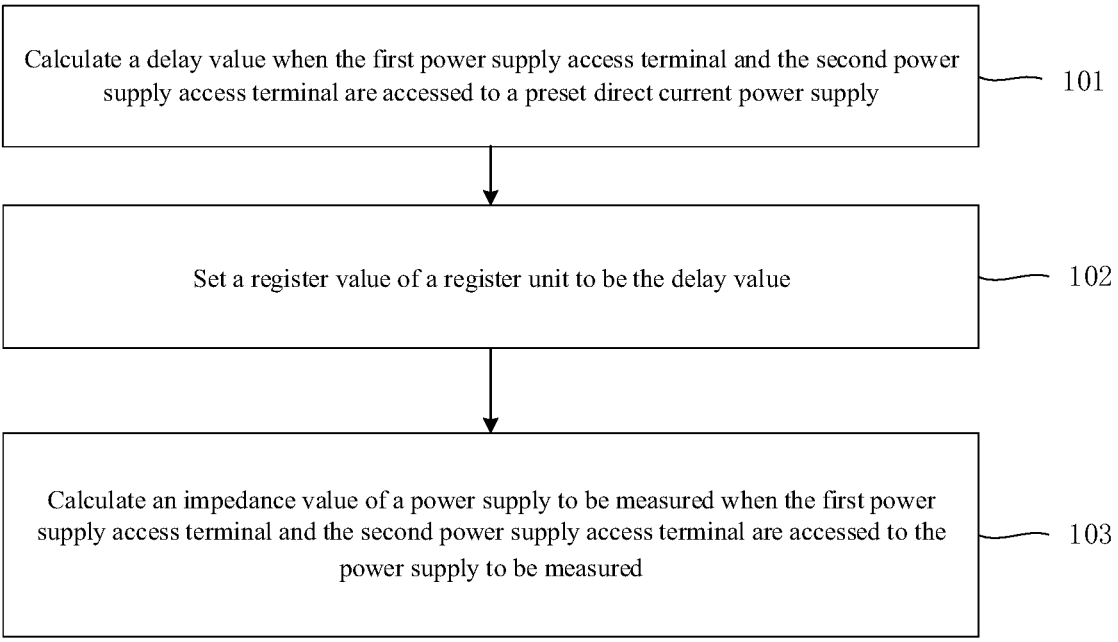
FIG. 2 is a flowchart of steps of a battery management method according to a second embodiment of the disclosure.

Referring to FIG. 2, a flowchart of steps of a battery management method according to an embodiment of the disclosure is illustrated. The method may be applied to any of the battery management devices described above, including the following steps.

In step 101, a delay value is calculated when the first power supply access terminal and the second power supply access terminal are accessed to a preset direct current power supply.

In the embodiment of the disclosure, the preset direct current power supply may be close to an ideal power supply that hardly generates phase shift. The delay value can be calculated by the impedance measuring element.

In step 102, a register value of a register unit is set to be the delay value.

In the embodiment of the present disclosure, in the comparator, the register value of the register unit can be set to the delay value calculated through the step 101.

In step 103, an impedance value of the power supply to be measured is calculated when the first power supply access terminal and the second power supply access terminal are accessed to the power supply to be measured.

In the embodiment of the disclosure, the delay caused by the driving element and the field effect unit can be compensated by the comparator. When the first power supply access terminal and the second power supply access terminal are accessed to the power supply to be measured, the delay caused by the driving element and the field effect unit can be prevented from being mistaken as the delay of the power supply to be measured, so that the calculated impedance value of the power supply to be measured is more accurate.

Preferably, the method further includes: managing the power supply to be measured according to the impedance value of the power supply to be measured.

In the embodiment of the disclosure, there is usually a direct corresponding relationship between the impedance value of the power supply to be measured and a temperature of the power supply to be measured. According to the impedance value of the power supply to be measured, performance indexes of the power supply to be measured such as a state of health, a charging state, the temperature and the like can be reflected, and then the power supply to be measured can be managed.

In conclusion, the embodiment of the disclosure provides the power management method that can be applied to the battery management device including the analog-digital converter, the impedance measuring element, the comparator, the driving element, the excitation signal generator, the first power supply access terminal and the second power supply access terminal. Before the battery management device is accessed to the power supply to be measured, the delay value of the battery management device can be calculated by accessing the preset direct current power supply close to an ideal power supply, so that the delay of the battery management device can be effectively prevented from being mistakenly calculated as the delay of the power supply to be measured, thus calculating the impedance value of the power supply to be measured more accurately. Secondly, setting the register value to the delay value can directly correct the delay of the battery management device in the comparator. When the battery management device is accessed to the power supply to be measured, the comparator will calculate the delay value in combination with the register value, which is the delay value caused by propagating a voltage signal of the power supply to be measured by the driving element and the field effect unit. Therefore, the battery management method provided by the embodiment of the disclosure is simple, convenient, accurate and reliable, so that the problem of inaccurate index testing in present battery management can be effectively solved.

Various processes implemented by each element in the device embodiment of FIG. 1 can be achieved by the above battery management method, and will not be repeated here to avoid repetition.

An embodiment of the disclosure further provides a battery management chip, including at least one battery management device described above, wherein at least one of the battery management devices is connected in cascade; and each of the battery management device correspondingly manages a power supply to be measured.

Figure 3:
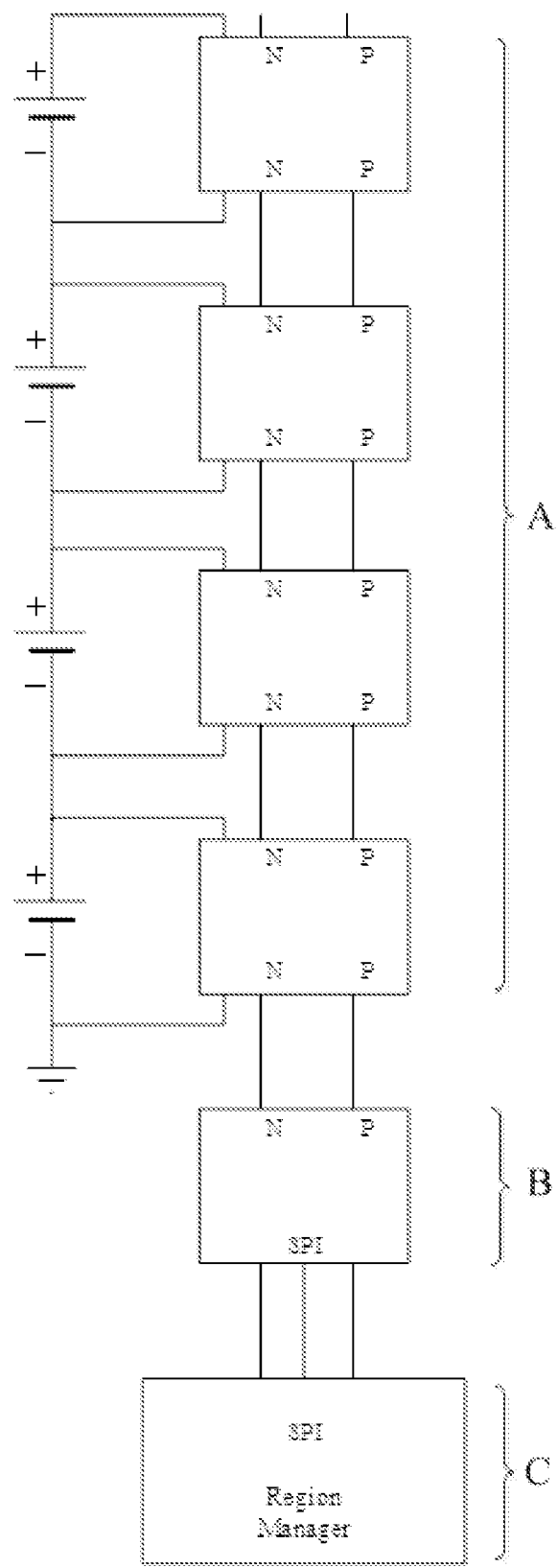
FIG. 3 is a schematic cascade diagram of a battery management chip according to an embodiment of the disclosure.

In specific applications, the battery management chip includes at least one battery management device. Since delays caused by the field effect unit 51 in different devices may have large deviation, when the battery management chip and the battery management device are assembled on an application board, automatic correction is necessary to achieve the purpose of automatically compensating for phase delay. When the battery management chip includes one battery management device, the battery management device manages one battery to be measured, and the battery management device is connected with a region manager for managing the battery to be measured. When the battery management chip includes at least two battery management devices, each battery management device correspondingly manages one battery to be measured, and the adjacent two battery management devices can be connected in cascade and then connected with the region manager, so that the at least two battery management devices can be managed uniformly through the region manager. FIG. 3 illustrates a schematic diagram when the battery management chip A includes a plurality of battery management devices B. Therefore, in the battery management chip A according to the embodiment of the disclosure, one battery management device B manages one battery, and then the battery management devices B are uniformly managed by the region manager C so that each battery can be accurately managed.

The embodiments in the disclosure are described step by step, the important part of each embodiment mainly lies in the difference between other embodiments, the same or similar part between each embodiment may be referred to each other.

It will be readily apparent to those skilled in the art that any combination of the above-described embodiments is possible; therefore, any combination of the above-described embodiments is an embodiment of the disclosure, but is not described in detail herein for the sake of brevity.

The battery management devices provided herein are not inherently related to a particular computer, virtual system or other equipment. Various general systems may also be used with the teaching based on the disclosure. According to the above description, the required structure for constructing such a system according to the solution of the disclosure is obvious. In addition, the disclosure is not directed to any particular programming language. It should be understood that a variety of programming languages can be used to implement the disclosed contents as described herein and above description to the particular programming language is to disclose the best inventive implementation mode of the disclosure.

Many details are discussed in the specification provided herein. However, it should be understood that the embodiments of the disclosure can be implemented without these specific details. In some examples, the well-known methods, structures and technologies are not shown in detail so as to avoid an unclear understanding of the specification.

Similarly, it should be understood that, in order to simplify the disclosure and to facilitate the understanding of one or more of various aspects thereof, in the above description of the exemplary embodiments of the disclosure, various features of the disclosure may sometimes be grouped together into a single embodiment, accompanying figure or description thereof. However, the method of this disclosure should not be constructed as follows: the disclosure for which the protection is sought claims more features than those explicitly disclosed in each of claims. More specifically, as reflected in the following claims, the inventive aspect is in that the features therein are less than all features of a single embodiment as disclosed above. Therefore, claims following specific embodiments are definitely incorporated into the specific embodiments, wherein each of claims can be considered as a separate embodiment of the disclosure.

Those of ordinary skills in the art may be aware that, in combination with the examples described in the embodiments disclosed herein, elements and algorithm steps may be implemented by electronic hardware or a combination of computer software and electronic hardware. Whether the functions are executed by hardware or software depends on particular applications and design constraint conditions of the technical solutions. Professionals may use different methods to implement the described functions for each particular application, but it should not be deemed that the implementation goes beyond the scope of the disclosure.

It can be clearly understood by those skilled in the art that, for the sake of convenience and brevity, a detailed working process of the foregoing system, device, and module may refer to a corresponding process in the foregoing method embodiments, and will not be elaborated herein.

In the several embodiments provided in the disclosure, it should be understood that the disclosed device and method may be implemented in other manners. For example, the device embodiments described above are merely illustrative. For example, the division of the modules is only one logical function division. In practice, there may be another division manner. For example, multiple modules or components may be combined or integrated into another system, or some features may be ignored or not performed. In addition, the illustrated or discussed mutual coupling or direct coupling or communication connection may be indirect coupling or communication connection through some interfaces, devices or modules, and may be in electrical, mechanical or other forms.

The modules illustrated as separated parts may be or may not be separated physically, and the parts shown in modules may be or may not be a physical module. That is, the parts may be located at one place or distributed in multiple network modules. Part or all modules therein may be selected according to actual needs to realize the objective of achieving the technical solution of the embodiment.

In addition, each functional module in each embodiment of the disclosure may be integrated in one processing module, or each module may exist alone physically, or two or more modules may be integrated in one module.

The functions may also be stored in a computer-readable storage medium if being implemented in the form of a software functional module and sold or used as an independent product. Based on this understanding, the essence of the technical solutions of the battery management method according to the disclosure, or contributions thereof to the prior art, or the part of the technical solutions, can be reflected in form of software products, and the computer software products can be stored in a storage medium including various commands, which are used for driving a computer device (which may be a personal computer, a server, or a network device) to execute all or a part of steps of the method described in all embodiments of the disclosure. The foregoing storage medium includes: any medium that is capable of storing program codes such as a USB flash drive, a mobile hard disk, a ROM, a RAM, a magnetic disk, or an optical disk.

The foregoing descriptions are merely detailed embodiments of the disclosure, but the protection scope of the disclosure is not limited thereto. Any person skilled in the art can easily think of changes or substitutions within the technical scope of the disclosure, and all the changes or substitutions should be covered by the protection scope of the disclosure. Therefore, the protection scope of the embodiments of the disclosure should be subjected to the protection scope of the claims.

What is claimed is:

1. A battery management device, comprising: an analog-digital converter, an impedance measuring element, a comparator, a driving element, an excitation signal generator, a first power supply access terminal and a second power supply access terminal, wherein:
the analog-digital converter is connected with the first power supply access terminal, the second power supply access terminal and the impedance measuring element; the analog-digital converter is configured to perform analog-digital conversion between an accessed power supply and the impedance measuring element; and the accessed power supply is: when the battery management device operates, a power supply to which the first power supply access terminal and the second power supply access terminal are accessed;
the impedance measuring element is further connected with the comparator and the driving element; the impedance measuring element is configured to test an impedance of the accessed power supply; the comparator is configured to compensate a delay generated by the driving element and the excitation signal generator; and the driving element is configured to drive the battery management device to work; and
the excitation signal generator is connected with the comparator, the driving element, the first power supply access terminal and the second power supply access terminal, and the excitation signal generator is configured to generate an excitation signal.

2. The battery management device according to claim 1, wherein the excitation signal generator comprises a field effect unit and a resistor;
a gate terminal of the field effect unit is connected with the driving element;
a drain terminal of the field effect unit is connected with the comparator and one terminal of the resistor;
a source terminal of the field effect unit is connected with the second power supply access terminal; and
the other terminal of the resistor is connected with the first power supply access terminal.

3. The battery management device according to claim 2, wherein a parasitic parameter capacitance value of the field effect unit satisfies a first preset condition.

4. The battery management device according to claim 2, wherein a drain source resistance of the field effect unit satisfies a second preset condition, and the drain source resistance is a resistance between the source terminal and the drain terminal of the field effect unit.

5. The battery management device according to claim 2, wherein a driving power of the driving element satisfies a third preset condition.

6. The battery management device according to claim 1, wherein the comparator comprises a register unit, and the accessed power supply comprises a preset direct current power supply, and a power supply to be measured;
the impedance measuring element is further configured to calculate a delay value when the first power supply access terminal and the second power supply access terminal are accessed to the preset direct current power supply;
the register unit is configured to set a register value to be the delay value; and the impedance measuring element is further configured to calculate an impedance value of the power supply to be measured when the first power supply access terminal and the second power supply access terminal are accessed to the power supply to be measured.

7. The battery management device according to claim 1, wherein the battery management device is applied to an automobile battery management system.

8. A battery management method, wherein the method is applied to the battery management device according to claim 1, the method comprising:
  calculating a delay value when the first power supply access terminal and the second power supply access terminal are accessed to a preset direct current power supply;
  setting a register value of a register unit to be the delay value; and
  calculating an impedance value of a power supply to be measured when the first power supply access terminal and the second power supply access terminal are accessed to the power supply to be measured.

9. The battery management method according to claim 8, further comprising:
  managing the power supply to be measured according to the impedance value of the power supply to be measured.

10. A battery management chip comprising a plurality of battery management devices, each battery management device comprising: an analog-digital converter, an impedance measuring element, a comparator, a driving element, an excitation signal generator, a first power supply access terminal and a second power supply access terminal, wherein:
  the analog-digital converter is connected with the first power supply access terminal, the second power supply access terminal and the impedance measuring element the analog-digital converter is configured to perform analog-digital conversion between an accessed power supply and the impedance measuring element and the accessed power supply is: when the battery management device operates, a power supply to which the first power supply access terminal and the second power supply access terminal are accessed;
  the impedance measuring element is further connected with the comparator and the driving element the impedance measuring element is configured to test an impedance of the accessed power supply; the comparator is configured to compensate a delay generated by the driving element and the excitation signal generator; and the driving element is configured to drive the battery management device to work; and
  the excitation signal generator is connected with the comparator, the driving element, the first power supply access terminal and the second power supply access terminal, and the excitation signal generator is configured to generate an excitation signal,
  wherein the plurality of battery management devices are connected in cascade; and each battery management device correspondingly manages a power supply to be measured.

* * * * *